(12) United States Patent
Choi

(10) Patent No.: US 7,608,543 B2
(45) Date of Patent: Oct. 27, 2009

(54) METHOD FOR PLANARIZING THIN LAYER OF SEMICONDUCTOR DEVICE

(75) Inventor: Jae Gon Choi, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 496 days.

(21) Appl. No.: 11/618,669

(22) Filed: Dec. 29, 2006

(65) Prior Publication Data

US 2008/0003828 A1    Jan. 3, 2008

(30) Foreign Application Priority Data

Jun. 30, 2006    (KR) .................... 10-2006-0061493

(51) Int. Cl.
*H01L 21/461* (2006.01)
(52) U.S. Cl. .............. 438/692; 257/E21.214; 257/E21.23; 257/E21.304
(58) Field of Classification Search .......... 257/E21.214, 257/E21.23, E21.304
See application file for complete search history.

(56) References Cited

U.S. PATENT DOCUMENTS

| 6,749,714 | B1 | 6/2004 | Ishikawa et al. | |
| 6,997,788 | B2 | 2/2006 | Wu et al. | |
| 2006/0083154 | A1 | 4/2006 | Nakatani et al. | |
| 2007/0048965 | A1* | 3/2007 | Hsieh et al. | 438/417 |
| 2007/0178662 | A1* | 8/2007 | Chen et al. | 438/424 |

FOREIGN PATENT DOCUMENTS

| KR | 1020040003649 A | | 1/2004 |
| KR | 2004-0106870 | * | 6/2006 |

* cited by examiner

*Primary Examiner*—Asok K Sarkar
(74) *Attorney, Agent, or Firm*—Townsend and Townsend and Crew LLP

(57) ABSTRACT

A method for planarizing a layer of a semiconductor device includes depositing a high density plasma (HDP) oxide layer over a wafer to have a reflective index distribution that is inversely proportional to a thickness distribution of the HDP oxide layer. A chemical mechanical polishing process is performed on the HDP oxide layer.

17 Claims, 3 Drawing Sheets

METHOD FOR PLANARIZING THIN LAYER OF SEMICONDUCTOR DEVICE

CROSS-REFERENCES TO RELATED APPLICATIONS

The present application claims priority to Korean patent application number 10-2006-0061493, filed on Jun. 30, 2006, which is incorporated by reference in its entirety.

BACKGROUND OF THE INVENTION

The present invention relates to a method for manufacturing a semiconductor device, and, more particularly, to a method for planarizing a layer.

A chemical mechanical polishing (CMP) process has been increasingly adopted in the manufacture of semiconductor devices as the degree of integration in semiconductor devices increases. Planarization based on the CMP process is used as one of the methods to prevent the generation of steps on respective regions of a highly integrated semiconductor device. As use of the CMP process increases, making improvements in polishing uniformity during the CMP process and thickness uniformity in a polished layer becomes important matters.

To improve planarization degree and polishing uniformity, research has focused mainly with the process parameters of the CMP process. For example, adjustment of the process parameters can be obtained by changing the kind of slurry used to polish the target layer deposited on a wafer or substrate, controlling the content of the slurry, replacing or modifying components of the CMP apparatus (e.g., the conditioner), adjusting the RPMs used in polishing, or adjusting the compressive force of the head. With the adjustments of these process parameters, various attempts have been made to improve the planarization degree and thickness uniformity of the layer.

Without considering the properties of the polishing target layer, attempts at adjusting the process parameters may lead to problems. Thus, it may be considered that a high degree of thickness uniformity or planarization required for the manufacture of the semiconductor device cannot be obtained only through the adjustment of the process parameters for the CMP process as described above.

In some cases, the thickness uniformity of the polishing target layer may be worse off after the CMP process has been performed. In the case of an oxide layer formed by high density plasma deposition (HDP), the central region of the wafer may likely have a thinner deposition thickness than the outer regions. The conventional CMP process generally uses ceria-based slurry, which provides a relatively high polishing rate near the central region of the wafer. Thus, when the conventional CMP process is performed on the HDP oxide layer, the polishing only increases the inconsistent thickness caused by the deposition.

SUMMARY OF THE INVENTION

The present invention provides a method for planarizing a layer of a semiconductor device, which can realize a more planar topology on a wafer layer through improvement in thickness uniformity of the polished layer.

In one embodiment, a method for planarizing a layer of a semiconductor device includes forming a target layer over a substrate having first and second regions to have a reflective index distribution. A first portion of the target layer deposited on the first region is provided with a first reflective index, and a second portion of the target layer deposited on the second region is provided with a second reflective index. The chemical mechanical polishing (CMP) is performed to planarize the target layer. The target layer is deposited over the first and second regions of the substrate with the reflective index distribution to compensate for a non-uniformity in the deposition thickness of the target layer over the first and second regions. The target layer is thicker at the first region than at the second region, and the first reflective index is higher than the second reflective index.

In one embodiment, the target layer is deposited over the first and second regions of the substrate with the reflective index distribution to compensate for differences in removal rates of the CMP process at the first and second regions of the substrate. The reflective index distribution of the target layer is based on a thickness distribution of a test layer.

In one embodiment, the method further comprises determining a relationship between a reflective index of the target layer to be deposited on the substrate and a removal rate of a chemical mechanical polishing process for the target layer; depositing a test layer on another substrate, the target layer and the test layer being of the same material; measuring a thickness distribution of the test layer, the thickness distribution of the test layer being used to represent a thickness distribution of the target layer; and obtaining the reflective index distribution from the relationship that would compensate the thickness distribution of the target layer.

In another embodiment, a method for planarizing a layer of a semiconductor device includes depositing a high density plasma deposition (HDP) oxide layer over a wafer to have a lower reflective index at a central region of the wafer than that at a peripheral region. A chemical mechanical polishing process is performed on the HDP oxide layer. The HDP oxide layer has a greater thickness at the peripheral region than at the central region.

In yet another embodiment, a method for planarizing a layer of a semiconductor device includes depositing a high density plasma (HDP) oxide layer over a wafer to have a reflective index distribution that is inversely proportional to a thickness distribution of the HDP oxide layer; and performing a chemical mechanical polishing process on the HDP oxide layer.

DESCRIPTION OF THE SPECIFIC EMBODIMENTS

Figure 1:
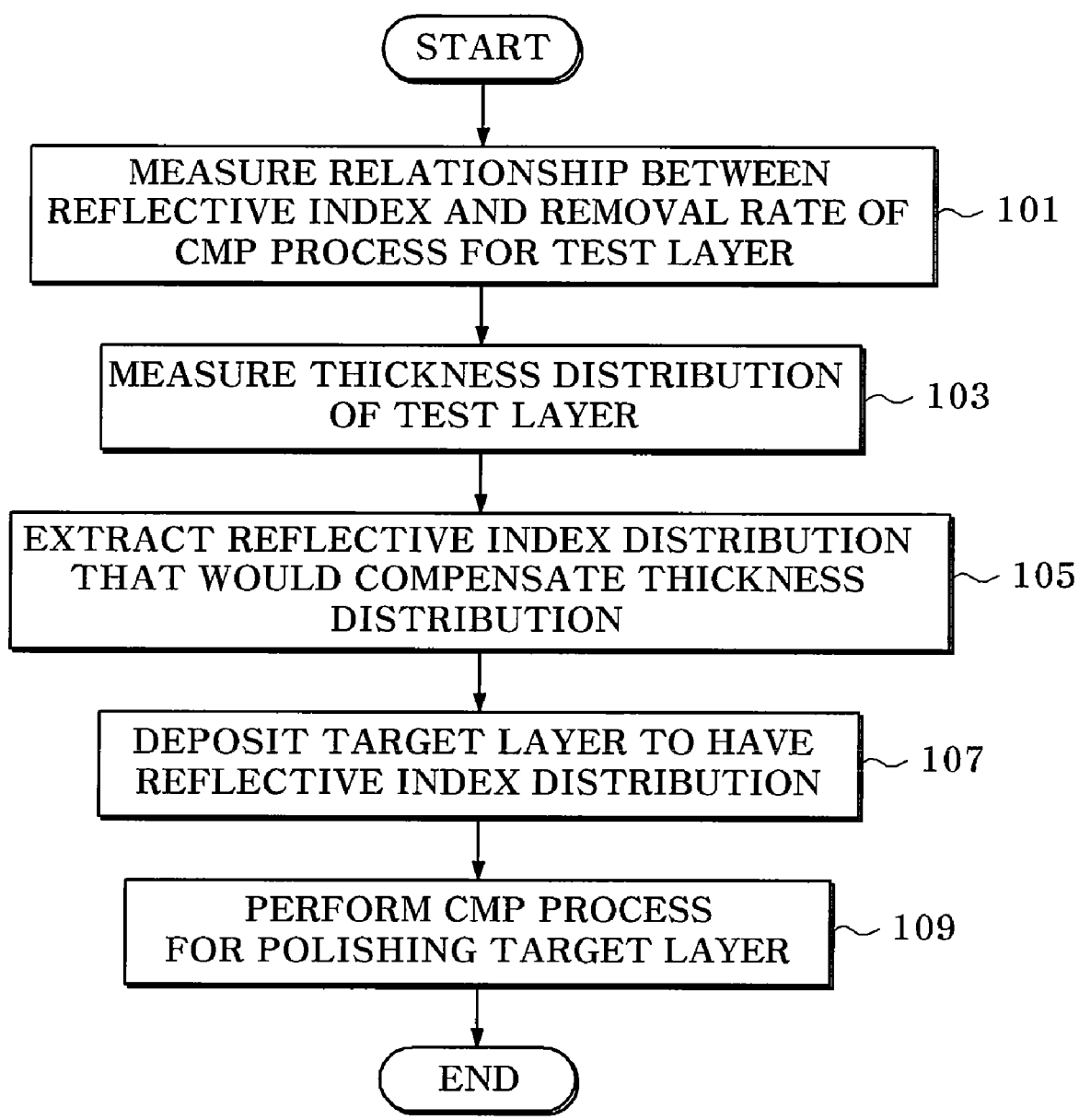
FIG. 1 is a schematic flow chart for a method for planarizing a layer of a semiconductor device according to one embodiment of the present invention.

An embodiment of the present invention is described which can compensate for non-uniform polishing during a chemical mechanical polishing (CMP) process using the deposition features of the oxide layer during planarization. The CMP process is adopted from a shallow trench isolation process or an interlayer dielectric layer forming process for a semiconductor memory device such as DRAM. For example, when depositing the HDP oxide layer, the reflective index (RI) distribution of the HDP oxide layer is adjusted to compensate for non-uniform polishing during a subsequent planarization process. Hence, the thickness uniformity of the polished HDP oxide layer is improved.

After deposition, the HDP oxide layer has a smaller thickness distribution in the central region of the wafer. This thickness distribution may be difficult to compensate simply by the subsequent CMP process. Rather, when performing the CMP process, the HDP oxide layer on the central region of the wafer is more rapidly polished than the peripheral region of the wafer. As a result, the semiconductor device may suffer from an uneven thickness distribution by obtaining a lower thickness on the central region of the wafer after polishing.

According to an embodiment of the present invention, when depositing the HDP oxide layer, the RI distribution of the HDP oxide layer can be controlled to compensate for the thickness distribution, improving the thickness uniformity of the polished oxide layer.

The RI distribution of the HDP oxide layer may be adjusted such that the RI of the HDP oxide layer is lower on the central region of the wafer and higher on the peripheral region. As a result, the removal rate of the CMP process can be varied to compensate for the thickness variation in the HDP oxide layer.

When depositing an oxide layer such as an HDP oxide layer, the RI distribution of the HDP oxide layer can be controlled by changing the location of the reaction gas supply port (e.g., nozzle) with respect to the wafer, changing the supply flow rate distribution of the reaction gas over the wafer.

For a layer such as an HDP oxide layer, the increase in RI increases the removal rate of the CMP process, and the decrease in RI decreases the removal rate. At this time, the CMP process may be performed using ceria-based slurries or alumina-base slurries. It should be noted that control of the RI means changes in optical properties of the layer rather than changes in the physical thickness of the layer itself. Thus, it should be understood that the change in the RI will not be accompanied with a substantial change in physical thickness.

When depositing the layer such as an HDP oxide layer, the RI distribution is lower at the central region of the wafer and higher at the peripheral region of the wafer since the wafer has a lower profile at the central region of the wafer and a higher profile at the peripheral region of the wafer. Accordingly, the thickness uniformity of the layer over the whole region of the wafer after polishing can be improved. From the measurement results, the RI is controlled in the range of about 1.4~1.6, and preferably in the range of 1.47~1.52.

Next, a method for planarizing a layer of a semiconductor device according to an embodiment of the present invention will be described with reference to FIG. 1. First, the relationship between the reflective index (RI) and the removal rate (R/R) of the CMP process for a test layer to be deposited on a wafer is measured (step 101). The test layer is made of the same material as the target layer that is to be deposited subsequently. Both the test and target layers are HDP oxide in the present implementation. This relationship between the RI and R/R can be obtained by measuring the reflective index and the removal rate of the CMP process after depositing the HDP oxide layer as the test layer on a sample wafer.

Figure 2:
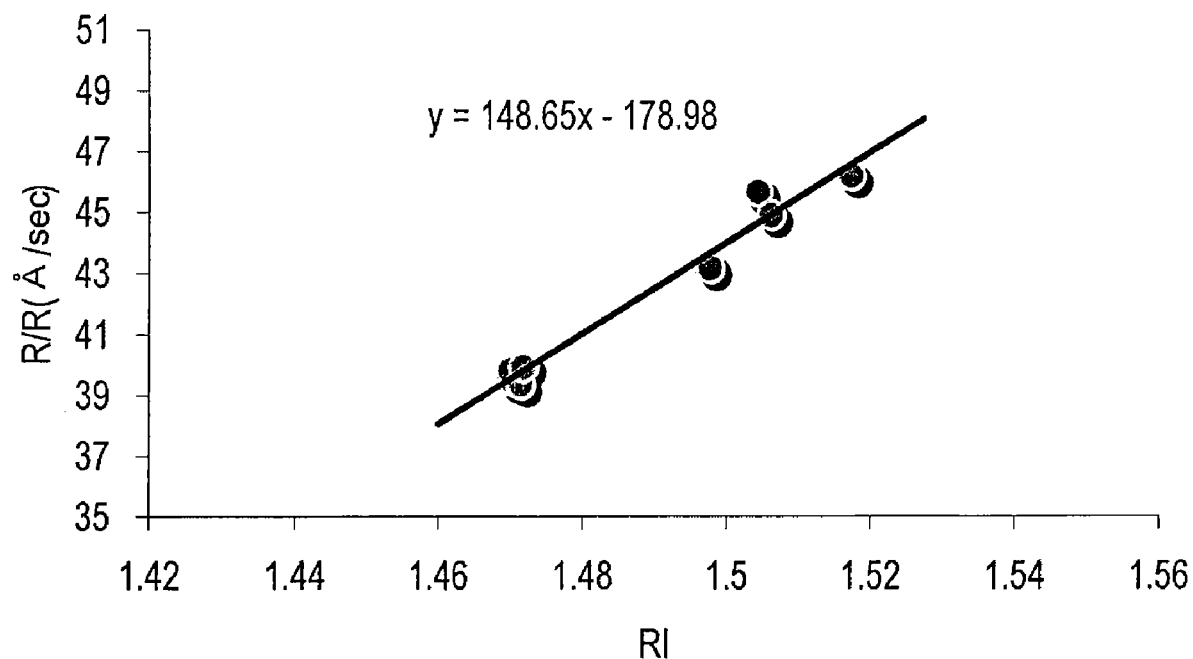
FIG. 2 is a graph plotting the relationship between the reflective index and the removal rate of a chemical mechanical polishing process on a high density plasma (HDP) oxide layer formed according to the embodiment.

FIG. 2 shows an experimental result of the relationship. In FIG. 2, it can be seen that, as the RI increases, the removal rate (R/R) of the CMP process increases. The following equation illustrates the relationship between RI and R/R: $y(R/R) = 148.65 \times RI - 178.98$.

Then, a test layer is deposited on a test wafer, and a thickness distribution of the test layer is measured (step 103). The thickness distribution of the test layer (e.g., the HDP oxide layer) can be measured as shown in a simulated-map of FIG. 3. From FIG. 3, it can be seen that the test layer is deposited with a lower thickness on the central region of the wafer than on the peripheral region.

Figure 3:
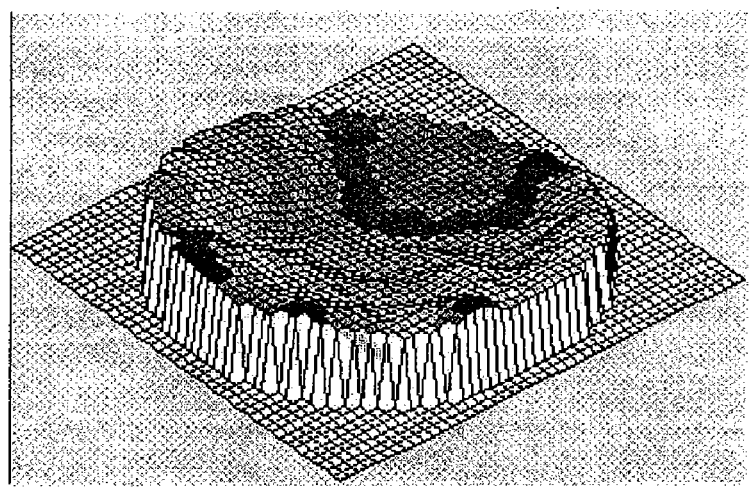
FIG. 3 is a thickness distribution wafer map of an HDP oxide layer directly after being deposited.

When performing the CMP process on the test layer, a distribution map of the reflective index is obtained to assist planarization of the test layer under consideration of the relationship between the R/R and the RI, and the thickness distribution map shown in FIG. 3 (step 105). According to the relationship between the R/R and the RI shown in FIG. 3, since the removal rate increases with RI, a distribution of the RI capable of compensating for the thickness variation of the oxide layer can be calculated using this relationship. The corresponding distribution of the RI is shown in a simulated-map in FIG. 4.

Figure 4:
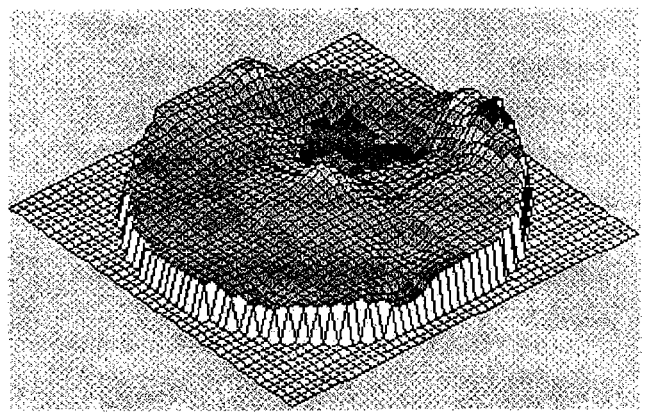
FIG. 4 is a thickness distribution wafer map of an HDP oxide layer deposited with a reflective index distribution.

Referring to FIG. 4, to obtain the RI distribution to compensate the thickness variation of the test layer shown in FIG. 3, it is desirable that the test layer be more thickly deposited on the peripheral region of the wafer than on the central region thereof. Thus, the RI distribution is preferably controlled to have a lower RI on the central region of the wafer and a higher RI on the peripheral region thereof.

Then, a target layer is deposited on the wafer to have the RI distribution obtained in the above operation (step 107). That is, the target layer is deposited on the wafer using the relationship shown in FIG. 2, so that the target layer has a higher RI at a thicker region of the wafer and a lower RI at a thinner region of the wafer.

Figure 6:
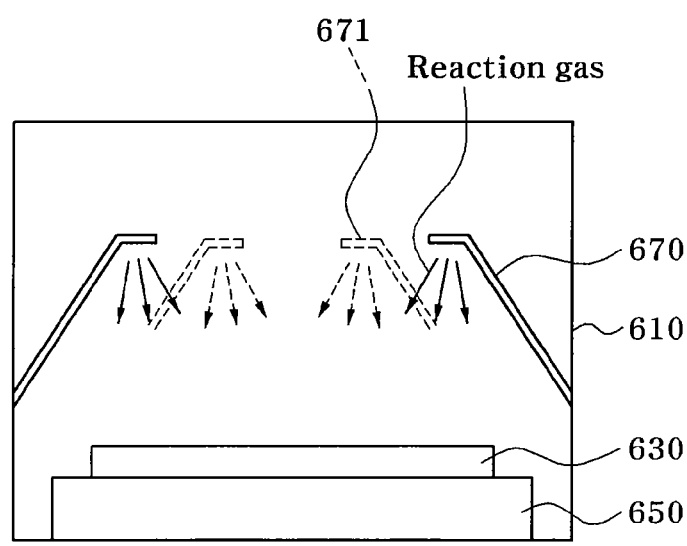
FIG. 6 is a schematic diagram of an apparatus for depositing an HDP oxide layer while controlling distribution of reflective index distribution according to the embodiment.

The non-uniform RI distribution can be realized by controlling the deposition conditions in each region of the wafer. For example, the HDP deposition is performed after a wafer 630 is mounted on a table such as a chuck 650 in a HDP deposition reaction chamber 610, as shown in FIG. 6.

Here, the HDP deposition process is performed in such a way that an HDP oxide layer (or the target layer) has different reflective indexes on the wafer 630 by inducing different supply fluxes of a reaction gas, for example, silane $SiH_4$, acting as a silicon source, when supplying the reaction gas through a nozzle 670.

For example, it is possible to induce the different fluxes of the reaction gas corresponding to the regions of the wafer by controlling or changing the location of the nozzle 670 with respect to the regions of the wafer 630.

That is, when the nozzle 670 is positioned above the peripheral region of the wafer 630, the HDP oxide deposited on the central region of the wafer has a lower RI than that of the HDP oxide deposited on the peripheral region of the wafer 630. It can be understood that this phenomenon is caused by a relative decrease in supply flux of the silicon source gas towards the center of the wafer 630 compared with the peripheral region of the wafer.

On the other hand, when the nozzle 670 is extended and positioned above the central region of the wafer 630, the HDP oxide on the central region of the wafer has a higher RI than that of the HDP oxide on the peripheral region of the wafer 630. This phenomenon is caused by an increase in the supply flux of the silicon source towards the central region of the wafer 630 compared with the peripheral region. Meanwhile, it should be noted that this method of supplying the reaction gas in the deposition equipment is based on the structure of the reaction chamber which comprises of a plurality of nozzles around the chuck to supply the reaction gas onto the wafer on the chuck.

In other words, the distribution of the RI can be changed without substantial change in the physical thickness of the polishing target layer on the wafer in such a way that, if an operator wishes to increase the RI, the operator locally increases the supply flux of the silicon source gas towards an associated location, and if the operator wishes to decrease the RI, the operator locally decreases the flux of the silicon source gas. Here, the RI is changed in the range of about 1.4~1.5 based on the relationship shown in FIG. 2.

In order to compensate for the thickness distribution of the HDP oxide layer, the HDP oxide layer is deposited (and etched) on the wafer while inducing the HDP oxide layer to have the RI distribution. Accordingly, as shown in FIG. 4, deposition of the HDP oxide layer having the RI distribution is obtained.

Figure 5:
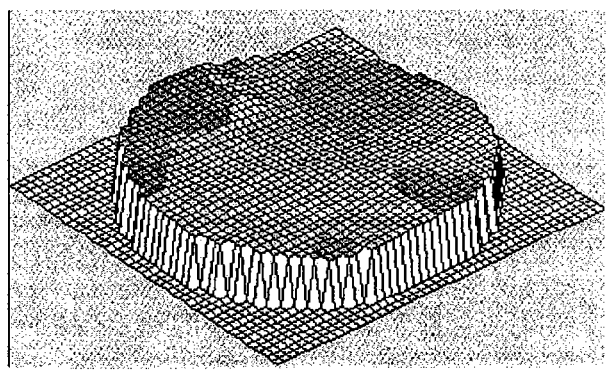
FIG. 5 is a thickness distribution wafer map of an HDP oxide layer after being polished, which shows effects of the embodiment.

Then, a final HDP oxide layer having improved thickness uniformity is obtained as shown in FIG. 5 by performing the CMP process on the polishing target layer (109). At this time, the CMP process may be performed using ceria-based slurries or alumina-base slurries. The CMP process may be performed using the ceria-based slurries in order to realize a high selection ratio with respect to a silicon nitride layer. In the present implementation, the CMP process is performed using a typical polishing pad and a typical etching apparatus used for polishing of the oxide layer.

As such, the HDP oxide layer as the target layer is deposited to have the RI distribution capable of compensating for the thickness distribution, thereby permitting the different removal rates of the CMP process on the regions of the wafer corresponding to the RI distribution. As a result, the polished target layer can have an improved thickness distribution after the CMP process compared with the thickness distribution caused by the deposition.

As apparent from the above description, the present invention can improve the process margins of mask formation, selective etching, etc., and effectively prevent variation of device characteristics between wafers in each process lot. Thus, yield and characteristics of the devices can be improved.

It should be understood that the embodiments and the accompanying drawings have been described for illustrative purposes. Further, those skilled in the art will appreciate that various modifications, additions and substitutions are allowed without departing from the scope and spirit of the invention. For example, the RI distribution between the peripheral region and the central region may be varied by means other than changing the position of the supply nozzle 670, as described above. The RI distribution may be varied by providing a plurality of supply ports over different regions of the wafer and adjusting each of these supply ports to control the flow rate of the silicon source gas to the different regions of the wafer. The scope of the invention should be interpreted based on the appended claims.

What is claimed is:

1. A method for planarizing a layer of a semiconductor device, the method comprising:
    forming a target layer over a substrate having first and second regions to have a reflective index distribution, wherein a first portion of the target layer deposited on the first region is provided with a first reflective index and a second portion of the target layer deposited on the second region is provided with a second reflective index, wherein first region is different from second region and a first reflective index is different from a second reflective index; and
    performing the chemical mechanical polishing (CMP) process to planarize the target layer.

2. The method of claim 1, wherein the target layer is deposited over the first and second regions of the substrate with the reflective index distribution to compensate for a non-uniformity in the deposition thickness of the target layer over the first and second regions, and
    wherein the target layer is thicker at the first region than at the second region, and the first reflective index is higher than the second reflective index.

3. The method of claim 2, wherein the target layer is deposited over the first and second regions of the substrate with the reflective index distribution to compensate for differences in removal rates of the CMP process at the first and second regions of the substrate.

4. The method of claim 1, wherein the reflective index distribution of the target layer is based on a thickness distribution of a test layer.

5. The method of claim 1, further comprising:
    determining a relationship between a reflective index of the target layer to be deposited on the substrate and a removal rate of a chemical mechanical polishing process for the target layer;
    depositing a test layer on another substrate, the target layer and the test layer being of the same material;
    measuring a thickness distribution of the test layer, the thickness distribution of the test layer being used to represent a thickness distribution of the target layer; and
    obtaining the reflective index distribution from the relationship that would compensate the thickness distribution of the target layer.

6. The method according to claim 1, wherein the target layer comprises a silicon oxide layer deposited using a high density plasma deposition (HDP) process.

7. The method according to claim 6, wherein a removal rate of the chemical mechanical polishing process for the HDP oxide layer increases corresponding to increase in a reflective index of the HDP oxide layer.

8. The method according to claim 7, wherein the HDP oxide layer has a higher reflective index at a location of where the HDP oxide layer is deposited to a greater thickness, and a lower reflective index at a location where the HDP oxide layer is deposited at a lower thickness.

9. The method according to claim 8, wherein the depositing of the HDP oxide layer comprises:
    adjusting a supply flow rate of a reaction gas in such a way to increase a supply flow rate of the reaction gas onto the first region, and decrease the supply flow rate of the reaction gas onto the second region, the first reflective index of the first region being higher than the second reflective index of the second region.

10. The method according to claim 9, wherein the depositing of the HDP oxide layer comprise:
    positioning a reaction gas supply nozzle f above and proximate to the first region.

11. The method according to claim 1, wherein the target layer is deposited over the substrate to have the reflective index distribution to be in the range of about 1.4~1.6.

12. A method for planarizing a layer of a semiconductor device, the method comprising:
    depositing a high density plasma deposition (HDP) oxide layer over a wafer to have a lower reflective index at a central region of the wafer than that at a peripheral region; and performing a chemical mechanical polishing process on the HDP oxide layer, wherein the HDP oxide layer has a greater thickness at the peripheral region than at the central region.

13. The method according to claim 12, wherein the depositing of the HDP oxide layer comprises:

supplying a reaction gas for the HDP oxide layer such that a supply flow rate of the reaction gas is lower at the central region of the wafer than at the peripheral region.

14. The method according to claim 12, wherein the depositing of the HDP oxide layer comprises:

positioning a reaction gas supply nozzle for supplying a reaction gas for the oxide layer proximate to the peripheral region.

15. The method according to claim 12, wherein the HDP oxide layer is deposited on the wafer to have a reflective index distribution between about 1.4~1.6 for the central region and the peripheral region of the wafer.

16. A method for planarizing a layer of a semiconductor device, the method comprising:

depositing a high density plasma (HDP) oxide layer over a wafer to have a reflective index distribution that is inverse proportional to a thickness distribution of the HDP oxide layer; and performing a chemical mechanical polishing process on the HDP oxide layer.

17. The method according to claim 16, wherein the depositing of the HDP oxide layer comprises:

supplying a reaction gas for the HDP oxide layer such that a supply flow rate of the reaction gas is less at a central region of the wafer than at of the peripheral region of the wafer.

* * * * *